(12) United States Patent
Ewanchuk et al.

(10) Patent No.: US 12,538,428 B2
(45) Date of Patent: Jan. 27, 2026

(54) ELECTRICAL CIRCUIT BOARD ASSEMBLIES

(71) Applicant: Simmonds Precision Products, Inc., Vergennes, VT (US)

(72) Inventors: Jeffrey Ewanchuk, Manchester, CT (US); Paul Martin Franz, Shelburne, VT (US); Christopher Fitzhugh, Essex Junction, VT (US); Scott R. Durkee, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 245 days.

(21) Appl. No.: 18/101,108

(22) Filed: Jan. 24, 2023

(65) Prior Publication Data

US 2024/0251507 A1 Jul. 25, 2024

(51) Int. Cl.
| H05K 1/18 | (2006.01) |
| H05K 1/11 | (2006.01) |
| H05K 3/00 | (2006.01) |
| H05K 3/30 | (2006.01) |
| H05K 3/40 | (2006.01) |

(52) U.S. Cl.
CPC ............ *H05K 1/186* (2013.01); *H05K 1/115* (2013.01); *H05K 3/0017* (2013.01); *H05K 3/30* (2013.01); *H05K 3/4038* (2013.01)

(58) Field of Classification Search
None
See application file for complete search history.

(56) References Cited

U.S. PATENT DOCUMENTS

| 5,770,300 | A | 6/1998 | Okamoto et al. |
| 6,922,339 | B2 | 7/2005 | Nakamura et al. |
| 6,980,074 | B1 | 12/2005 | Jitaru |
| 8,110,915 | B2 | 2/2012 | Fowlkes et al. |
| 8,664,656 | B1 * | 3/2014 | Arnold ............ H05K 1/00 257/690 |
| 9,648,722 | B2 | 5/2017 | Gerhäußer |

(Continued)

FOREIGN PATENT DOCUMENTS

| EP | 2947975 A1 | 11/2015 |
| WO | 2022078725 A1 | 4/2022 |

OTHER PUBLICATIONS

Extended European Search Report for European Patent Application # 24153706.7, Dated Jul. 3, 2024, 21 Pages.

*Primary Examiner* — Krystal Robinson
(74) *Attorney, Agent, or Firm* — Kinney & Lange, P.A.

(57) ABSTRACT

A circuit board assembly can include a circuit component die, a first dielectric layer disposed on a first side of the circuit component die made of a first dielectric material having a high thermal conductivity, a second dielectric layer disposed on a second side of the circuit component die made of the first dielectric material, and a bulk dielectric material having a lower thermal conductivity than the first dielectric material. The bulk dielectric material can have a lower glass transition temperature than the first dielectric material and being heterogeneous to the first dielectric material. The bulk dielectric material can be in flowed contact with lateral sides of the circuit component die, the first dielectric layer, and the second dielectric layer to laterally enclose the circuit component die, the first dielectric layer, and the second dielectric layer.

16 Claims, 4 Drawing Sheets

(56) References Cited

U.S. PATENT DOCUMENTS

| | | | |
|---|---|---|---|
| 9,867,277 B2 | 1/2018 | Standing et al. | |
| 9,899,330 B2 | 2/2018 | Dalal et al. | |
| 10,211,177 B2 | 2/2019 | Viswanathan et al. | |
| 10,361,121 B2 | 7/2019 | Darmawikarta et al. | |
| 10,586,785 B2 | 3/2020 | Gao et al. | |
| 2012/0126401 A1* | 5/2012 | Lin .................. | H01L 25/105 |
| | | | 257/737 |
| 2014/0246227 A1* | 9/2014 | Lin .................. | H05K 3/4697 |
| | | | 174/266 |
| 2021/0143103 A1 | 5/2021 | Mrad et al. | |
| 2022/0199483 A1 | 6/2022 | Debbadi et al. | |

* cited by examiner

*Fig. 1*

Cut high-k resin sheets and place die

*Fig. 2A*

Cut high flow resin sheets and laminate

ELECTRICAL CIRCUIT BOARD ASSEMBLIES

FIELD

This disclosure relates to electrical circuit assemblies.

BACKGROUND

Miniaturization of power converters in actuation systems is an ongoing need. Embedded power dies offer the potential to radically reduce the required volume, but the thermal management of the dies can be challenging. High thermal conductivity materials exist for PCB integration, but they are difficult to use due to their dissimilar mechanical properties compared to the rest of the assembly. Hence, they are typically integrated near the heat sink alone, external to the converter.

Power converters can be used in space limited applications, e.g., in guided projectiles to actuate the fins used in guidance in a unit called the CAS (control and actuation system). Volume of the CAS within the projectile occupies space otherwise needed for additional sensors or other components. State of the art CAS packages include a variety of surface mounted electronics, power devices and sensors on a PCB. Traditionally, multiple PCBs have been necessary to include all desired devices in certain applications, thereby reducing the reliability of the design.

Such conventional methods and systems have generally been considered satisfactory for their intended purpose. However, there is still a need in the art for improvements. The present disclosure provides a solution for this need.

SUMMARY

A circuit board assembly can include a circuit component die, a first dielectric layer disposed on a first side of the circuit component die made of a first dielectric material having a high thermal conductivity, a second dielectric layer disposed on a second side of the circuit component die made of the first dielectric material, and a bulk dielectric material having a lower thermal conductivity than the first dielectric material. The bulk dielectric material can have a lower glass transition temperature than the first dielectric material and being heterogeneous to the first dielectric material. The bulk dielectric material can be in flowed contact with lateral sides of the circuit component die, the first dielectric layer, and the second dielectric layer to laterally enclose the circuit component die, the first dielectric layer, and the second dielectric layer.

The first dielectric layer can be flush with the bulk dielectric material such that the first dielectric layer and the bulk dielectric material form a first planar surface. The second dielectric layer can be flush with the bulk dielectric material such that the second dielectric layer and the bulk dielectric material form a second planar surface.

The assembly can include a first conductive layer disposed in contact with the first planar surface to be in contact with the first dielectric layer and the bulk dielectric material. The assembly can include a second conductive layer disposed in contact with the second planar surface to be in contact with the second dielectric layer and the bulk dielectric material.

In certain embodiments, the assembly can include one or more first vias defined through the first conductive layer and the first dielectric layer to the circuit component die, and one or more second vias defined through the second conductive layer and the second dielectric layer to the circuit component die. The one or more first vias and the one or more second vias can be filled with conductive material, for example. The assembly can include any other suitable additional structuring, for example.

In accordance with at least one aspect of this disclosure, a method for embedding a circuit component die within a circuit board assembly can include disposing a first dielectric layer made of a first dielectric material having a high thermal conductivity on a first conducive layer, disposing the circuit component die on the first dielectric layer, and disposing a second dielectric layer made of the first dielectric material on the circuit component die. The method can also include stacking a plurality of sheets of a bulk dielectric material having a lower thermal conductivity than the first dielectric material on the first conductive layer and around the first dielectric layer, the second dielectric layer, and the circuit component die. Each sheet can include an opening at least as wide as the first dielectric layer and the second dielectric layer, the bulk dielectric material having a lower glass transition temperature than the first dielectric material.

The method can include disposing a second conductive layer on the second dielectric layer and the stacked plurality of sheets of the bulk dielectric material to form a sandwich structure having the first dielectric layer, the second dielectric layer, the circuit component die, and the bulk dielectric material between the first conductive layer and the second conductive layer. The method can include heating the sandwich structure to a temperature at or above the glass transition temperature of the bulk dielectric material but below the glass transition temperature of the first dielectric layer and the second dielectric layer to flow the bulk dielectric material around the first dielectric layer, the second dielectric layer, and the circuit component die to remove air pockets.

The method can include milling one or more first vias through the first conductive layer and the first dielectric layer to the circuit component die. The method can further include milling one or more second vias defined through the second conductive layer and the second dielectric layer to the circuit component die. In certain embodiments, milling can include UV drilling and cleaning.

The method can include filling the one or more first vias and one or more second vias with conductive material. In certain embodiments, filling can include a deposition process. For example, the deposition process can be or include copper plating. The method can include adding additional circuit board structure on to the first conductive layer and the second conductive layer. The method can include thick copper bonding the assembly with a third dielectric layer having a high thermal conductivity.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIGS. 2A, 2B, 2C, 2D, 2E, and 2F show an embodiment of a method for making one or more embodiments of this disclosure, e.g., the embodiment of FIG. 1, wherein FIG. 2A shows first and second dielectric layers with a die therebetween being disposed on a first conductive layer, wherein FIG. 2B shows layers of a bulk dielectric material being placed around the first and second dielectric layers and the die on the first conductive layer, with a second conductive layer being placed on top to form a sandwich structure, wherein FIG. 2C shows the bulk dielectric material heated and flowed to fill in air gaps and subsequent milling to create vias, wherein FIG. 2D shows filling the vias with conductive material and/or adding additional conductive material to the first and second conductive layers, wherein FIG. 2E shows additional structuring and panel cutting, and wherein

DETAILED DESCRIPTION

Figure 1:
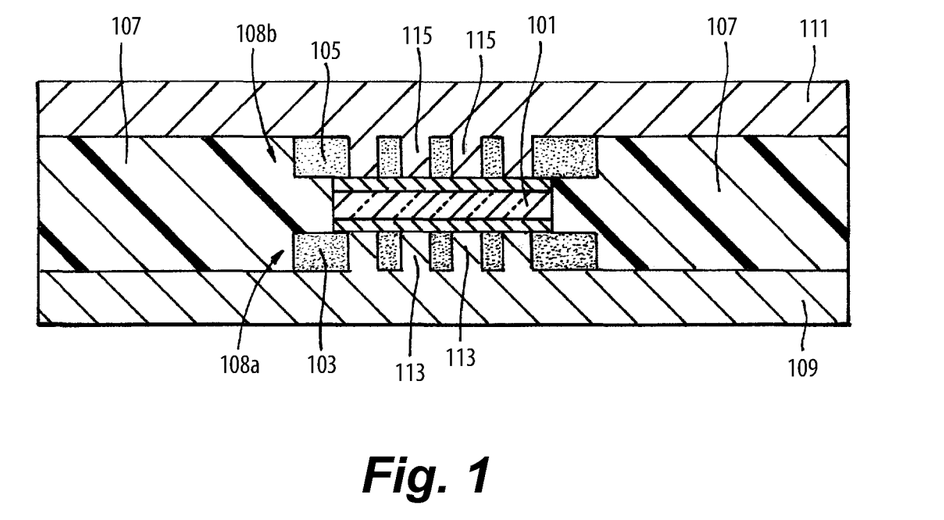
FIG. 1 is a cross-sectional schematic diagram of an embodiment of an assembly in accordance with this disclosure.

Reference will now be made to the drawings wherein like reference numerals identify similar structural features or aspects of the subject disclosure. For purposes of explanation and illustration, and not limitation, an illustrative view of an embodiment of an assembly in accordance with the disclosure is shown in FIG. 1 and is designated generally by reference character 100. Other embodiments and/or aspects of this disclosure are shown in FIGS. 2A-2F.

Referring to FIG. 1, a circuit board assembly 100 can include a circuit component die 101 (e.g., a transistor component), and a first dielectric layer 103 disposed on a first side of the circuit component die 101 and made of a first dielectric material having a high thermal conductivity (e.g., an epoxy resin sheet). The assembly 100 can include a second dielectric layer 105 disposed on a second side of the circuit component die 101 made of the first dielectric material. The first dielectric layer 103 and the second dielectric layer 105 can include a thermally conductive adhesive on one or both sides to adhere to the die 101 and/or other surface (e.g., conductive layers 109, 111 disclosed below).

The assembly 100 can also include a bulk dielectric material 107 that has a lower thermal conductivity than the first dielectric material (e.g., FR4 circuit board material). The bulk dielectric material 107 can have a lower glass transition temperature than the first dielectric material and can be heterogeneous to the first dielectric material, for example. The bulk dielectric material 107 can be in flowed contact with lateral sides (e.g., left and right as shown) of the circuit component die 101, the first dielectric layer 103, and the second dielectric layer 105 to laterally enclose the circuit component die 101, the first dielectric layer 103, and the second dielectric layer 105, e.g., as shown.

The first dielectric layer 103 can be flush with the bulk dielectric material 107 (e.g., at a bottom side) such that the first dielectric layer 103 and the bulk dielectric material 107 form a first planar surface 108a. The second dielectric layer 105 can be flush with the bulk dielectric material 107 (e.g., at a top side) such that the second dielectric layer 105 and the bulk dielectric material 107 form a second planar surface 108b.

The assembly 100 can include a first conductive layer 109 (e.g., made of copper or other suitable conductive material) disposed in contact with the first planar surface 108a to be in contact with the first dielectric layer 103 and the bulk dielectric material 107. The assembly 100 can include a second conductive layer 111 (e.g., made of copper or other suitable conductive material) disposed in contact with the second planar surface 108b to be in contact with the second dielectric layer 105 and the bulk dielectric material 107.

In certain embodiments, the assembly 100 can include one or more first vias 113 defined through the first conductive layer 109 and the first dielectric layer 103 to the circuit component die 101, and one or more second vias 115 defined through the second conductive layer 111 and the second dielectric layer 105 to the circuit component die 101. The one or more first vias 113 and the one or more second vias 115 can be filled with conductive material (e.g., the same as the conductive layer, e.g., copper), for example. The assembly 100 can include any other suitable additional structuring added to the assembly 100, for example (e.g., one or more additional layers of bulk dielectric material, conductive material, etc., e.g., to form a multilayer circuit board).

Figure 2A:
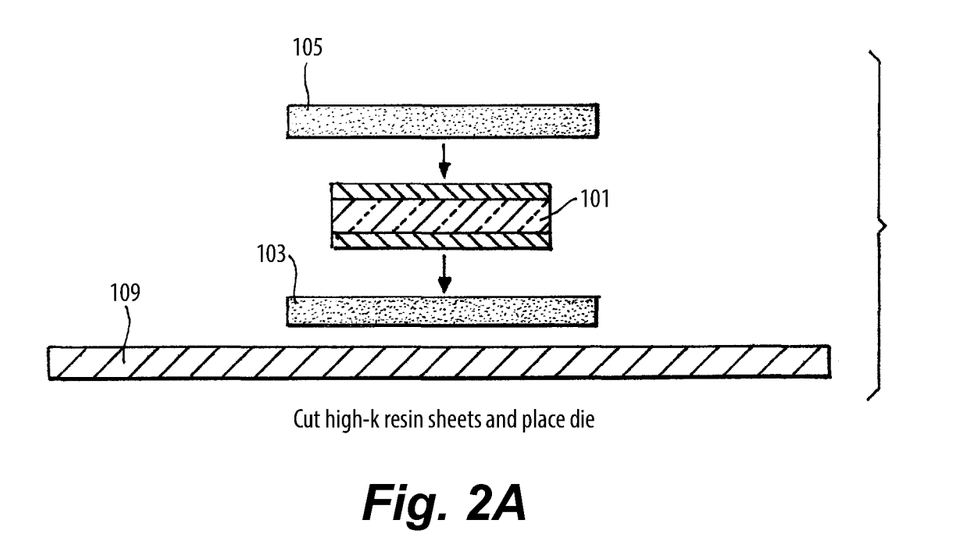
Figure 2B:
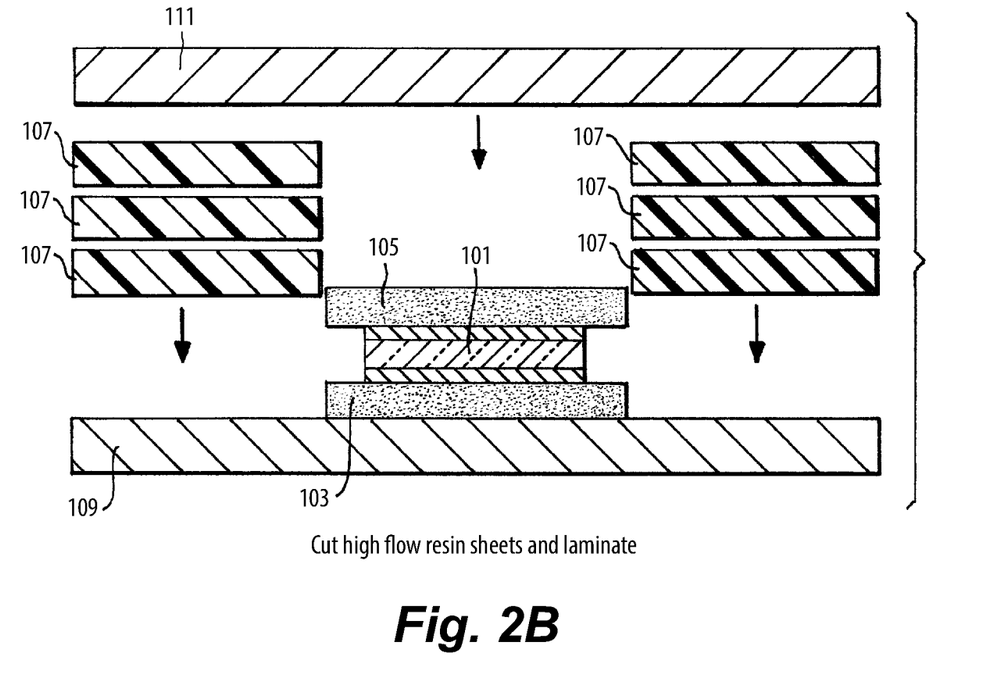

FIGS. 2A, 2B, 2C, 2D, 2E, and 2F show an embodiment of a method for making one or more embodiments of this disclosure, e.g., including the embodiment as shown of FIG. 1. FIG. 2A shows first and second dielectric layers 103, 105 with a die 101 therebetween being disposed on a first conductive layer 109. FIG. 2B shows layers of a bulk dielectric material 107 being placed around the first and second dielectric layers 103, 105 and the die 101 on the first conductive layer 109, with a second conductive layer 111 being placed on top to form a sandwich structure. The layers of bulk dielectric material 107 can have a hole cut into each layer to fit the first and second dielectric layers 103, 105 and the die 101.

Figure 2C:
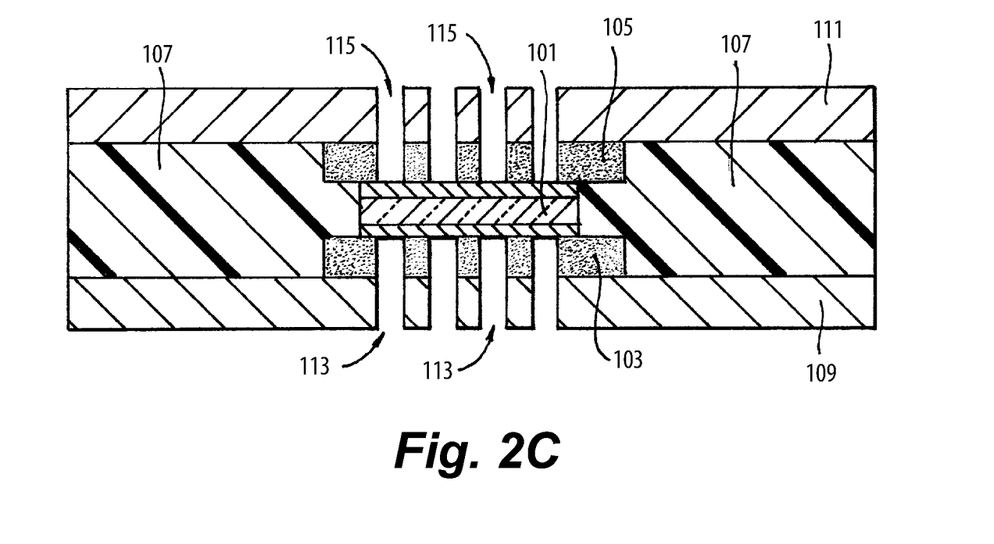
Figure 2D:
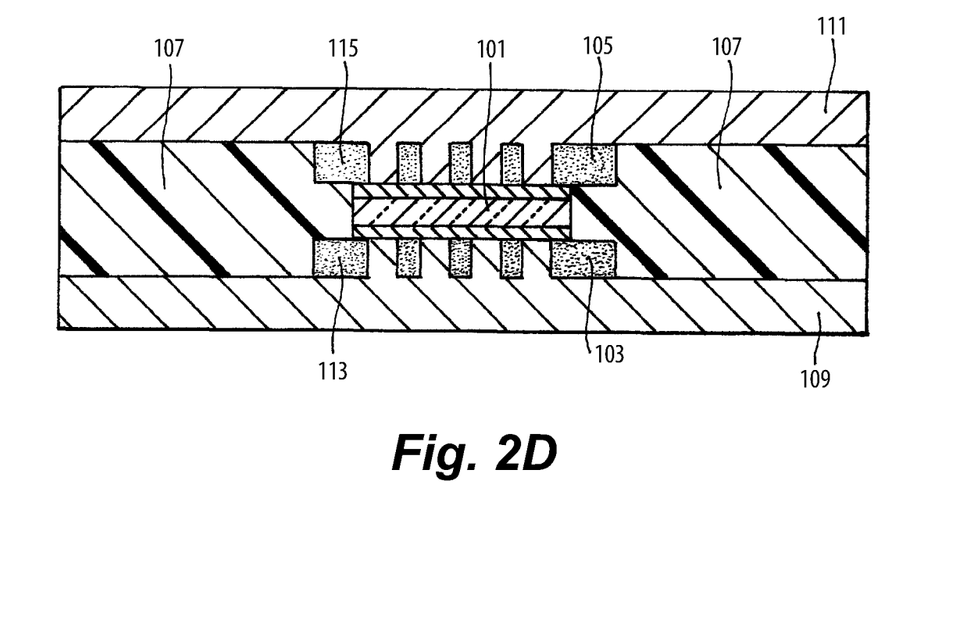
Figure 2E:
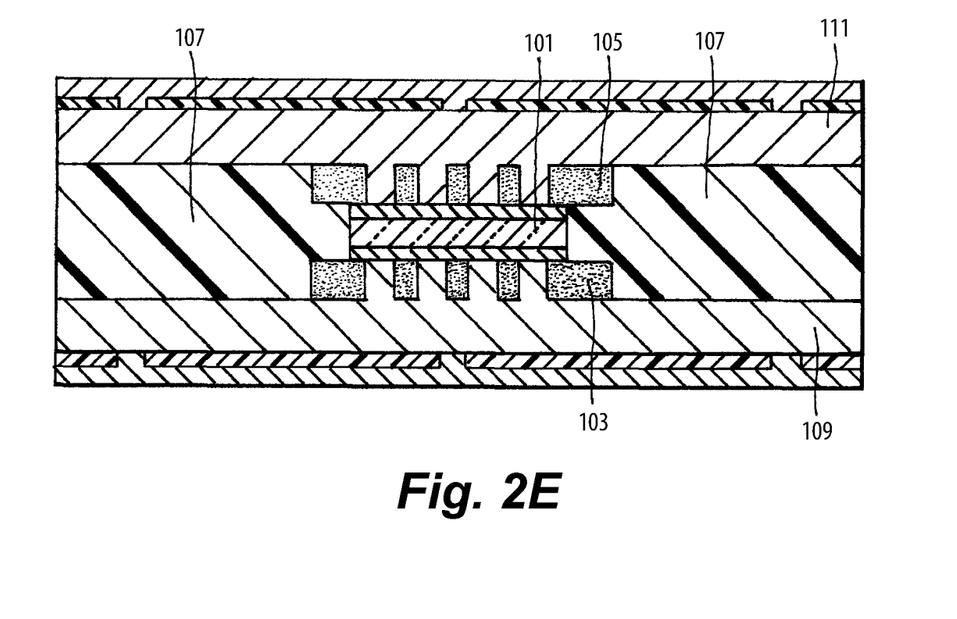
Figure 2F:
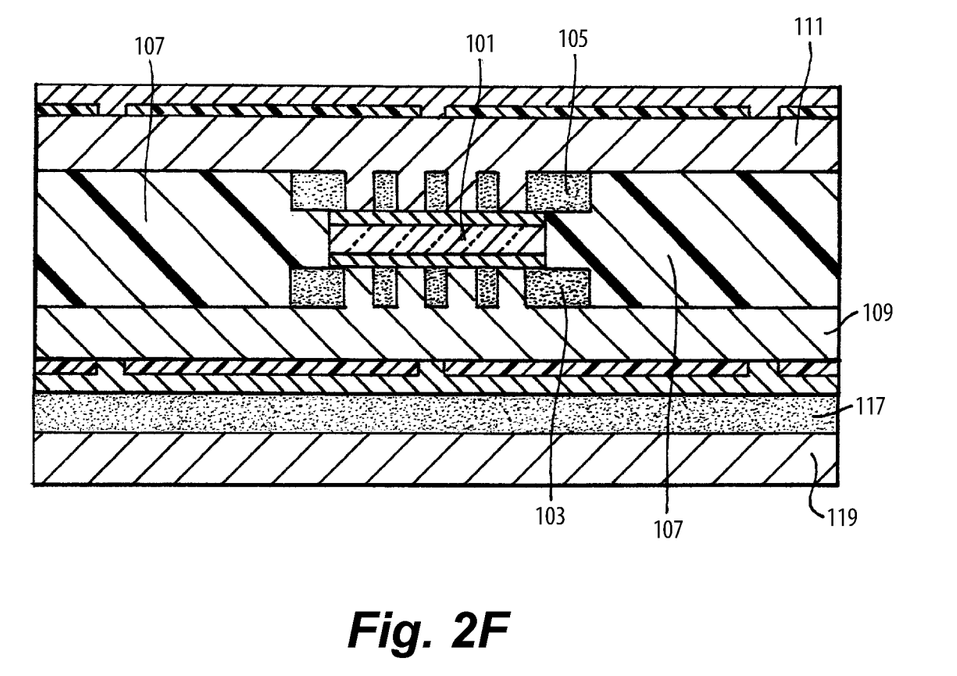
FIG. 2F shows thick copper bonding with a high thermal conductivity sheet (e.g., which can be a low temperature process).

FIG. 2C shows the bulk dielectric material heated and flowed under pressure to fill in air gaps and subsequent milling (e.g., UV drilling and cleaning) to create vias 113, 115. FIG. 2D shows filling the vias 113, 115 with conductive material (e.g., via copper deposition) and/or adding additional conductive material to the first and second conductive layers 109, 111. FIG. 2E shows additional structuring and panel cutting of the assembly. FIG. 2F shows thick copper bonding with a high thermal conductivity sheet (e.g., which can be a low temperature process).

In accordance with at least one aspect of this disclosure, as shown in FIGS. 2A, for example, a method for embedding a circuit component die 101 within a circuit board assembly 100 can include disposing a first dielectric layer 103 made of a first dielectric material (e.g., as described above) having a high thermal conductivity on a first conducive layer 109. The method can include disposing the circuit component die 101 on the first dielectric layer 103, and disposing a second dielectric layer 105 made of the first dielectric material on the circuit component die 101. As shown in FIG. 2B, for example, the method can also include stacking a plurality of sheets of a bulk dielectric material 107 having a lower thermal conductivity than the first dielectric material on the first conductive layer 109 and around the first dielectric layer 103, the second dielectric layer 105, and the circuit component die 101. Each sheet can include an opening 107a at least as wide as the first dielectric layer 103 and the second dielectric layer 105 (e.g., so each sheet of material 107 can advance). The bulk dielectric material 107 can have a lower glass transition temperature than the first dielectric material, for example. The method can include disposing a second conductive layer 111 on the second dielectric layer 105 and the stacked plurality of sheets of the bulk dielectric material to form a sandwich structure having the first dielectric layer 103, the second dielectric layer 105, the circuit component die 101, and the bulk dielectric material 107 between the first conductive layer 109 and the second conductive layer 111.

As shown in FIG. 2C, the method can include heating the sandwich structure to a temperature at or above the glass transition temperature of the bulk dielectric material 107 but below the glass transition temperature of the first dielectric layer 103 and the second dielectric layer 105 to flow the bulk dielectric material 107 around the first dielectric layer 103, the second dielectric layer 105, and the circuit component die 101, e.g., to remove air pockets. The method can include milling one or more first vias 113 through the first conductive layer 109 and the first dielectric layer 103 to the circuit component die 101. The method can further include milling one or more second vias 115 defined through the second conductive layer 111 and the second dielectric layer 105 to the circuit component die 101. In certain embodiments, milling can include UV drilling and cleaning, for example.

As shown in FIG. 2D, the method can include filling the one or more first vias 113 and one or more second vias 115 with conductive material. In certain embodiments, filling can include a deposition process. For example, the deposition process can be or include copper plating.

As shown in FIGS. 2E, the method can include adding additional circuit board structure on to the first conductive layer 109 and the second conductive layer 111. The method can include thick copper bonding the assembly (e.g., to a thick copper layer 119) with a third dielectric layer 117 having a high thermal conductivity (e.g., made of the first dielectric material). The method can also include any suitable method(s) and/or portion(s) thereof.

One having ordinary skill in the art appreciates what materials can be selected for each material type without undue experimentation (e.g., that allows bulk dielectric material 107 to flow at a temperature below that of the dielectric layers 103, 105 and below a temperature at which the die 101 could be damaged). For example, the first dielectric material can be an epoxy resin that has high thermal conductivity, but also has too high of a glass transition temperature for application to the die 101 (e.g., the glass transition temperature of the first dielectric material causes damage to the die 101 or other components of the circuit board assembly). Any suitable materials that function accordingly relative to each other are contemplated herein, for example.

Certain embodiments can be used to create circuit boards for certain control and actuation systems (e.g., for a guided projectiles). Embodiments can make smaller and lighter circuit board assemblies while being able to handle suitable power/thermal requirements. Embodiments can allow embedding of a power die into a printed circuit board (PCB) structure.

Certain embodiments of a method can include cutting a high k sheet and placing it on a carrier sheet. The high-k sheet can have an adhesive layer that adheres to the carrier sheet (e.g., copper foil). The method can include placing the die onto the high k sheet, then placing a second high k sheet onto the die. In certain embodiments, each high k sheet can be about 2-3 thousands of an inch in thickness, for example. The die, e.g., the power component, can thus be positioned in the middle between high k sheets. The die can be a MOSFET switch, or a diode, or an IGBT, or any other suitable semiconductor component, for example. The die can be a semiconductor material, for example. The die can have a thickness of about 200-400 micrometers or other suitable thickness. The die can include a copper metallization on the outer surface, which can act as a stop for the laser in drilling, and help connect copper material during a plating stage. The die may not be capable of handling temperatures required to cause flow of the high-k sheets. In embodiments of a method, the high k material does not flow, and only a bulk dielectric material does which has a substantially lower glass transition temperature. This avoids components from being exposed to high-k material glass transition temperature.

The method can include stacking sheets of bulk dielectric material (e.g., standard sheets of FR4) to match the thickness of the two high k layers and the die combined. The method can include milling the FR4 sheets, before or after stacking, to have an opening large enough to fit the die and high k sheets (e.g., sized to allow the flow of the bulk dielectric material to fill in the gaps, e.g., 25% wider than the area of the high k sheets). The die and high k sheets can be disposed within the opening (e.g., by inserting the die and high k sheets or stacking the sheets around the die). Embodiments of a method can include adding another copper foil to the top of the assembly.

The method can include then heating under pressure the sheets of bulk dielectric material to or above the glass transition temperature thereof to flow the bulk dielectric material. The temperature at which FR4, for example, flows is much lower than for the high k epoxy resin sheets for example, and lower than the maximum temperature the die can sustain. Embodiments can include laser drilling and cleaning to make microvias as well as additional structuring/layering as desired. Embodiments can include any suitable thickness of layers dependent upon a desired thermal conductivity and electrical conductivity and the constraints of the two parameters.

Embodiments can result in replacement of some volume of the bulk dielectric material that has a lower thermal conductivity material with a high k material, even though such differing materials are heterogeneous without introducing any structural issues such as air gaps.

Embodiments can provide a means to embedded power devices into a heterogeneous substrate with high thermal conductivity materials forming the dielectric for the microvia network. Embodiments can be applied to the actuation systems.

Certain embodiments of a method can include cutting high-k sheets to a die template and using component co-ordinates to locate position on a copper foil, placing a copper metallized power die (face down or up) and covering the die with second high-k sheet, milling and structuring laminate and upper copper foils, and laminating the structure. Certain embodiments of the method can include laser milling microvia structures on a top and bottom side of the die through the copper foils, cleaning, electroplating copper, and polishing. Certain embodiments of a method can include repeating to achieve a desired thickness of copper. Certain embodiments of a method can include performing additional lamination steps to add layers. Certain embodiments of a method can include segmenting panels, and bonding final thick copper (e.g., about >1 mm) on sectioned panels with the high-k sheet at low temperature but elevated pressure. Embodiments can result in embedded power devices with improved thermal performance for increased miniaturization of circuit boards and associated systems.

Embodiments can provide near die and far die electrical isolation with high thermal conductivity for reduced thermal resistance. Embodiments can provide an embedded power die in a substrate with multi-material laminations having a mix of low flow and high flow materials to achieve high thermal performance, but without air gaps in the process which allows high voltage operation. Embodiments can provide thick copper bonding to an embedded power converter with pre-fabricated copper blocks.

Embodiments can use high thermally conductive epoxy resin sheets that have significantly higher glass transition temperature compared to normal FR4 epoxy sheets. To flow the high k material requires high processing temperature and pressures during the lamination stage, which can reduce yield due to power die fracturing. Using embodiments of a method overcomes the requirement of the highly thermally conductive epoxy sheets be required to flow to form the entire assembly. High flow resin materials can instead be used in the embedding process at normal temperatures and pressure, with high-k sheets being used to hold the power die in place only for process, for example. Embodiments can provide very good heat spreading due to high-k material being interleaved with copper microvias, for example. Certain embodiments can provide thermal conductivity improvement of about 30% assuming standard process via densities based on analytical estimation compared to a circuit equivalent structure (using typical uvia to uvia spacing offered by PCB fabricators). As the vias do not have to be dense or alternate between FR4 (which is a thermal insulator) to achieve good thermal performance, the via ratios can be made more process friendly, reducing the cost to achieve high performance packaging of the component.

Certain embodiments can use the same bonding sheet at the last step at the process post panel segmentation to remove having to plate the heat sink layer in the same panel process flow. Thus the production time can be improved, and the costs can be reduced.

Traditional systems use dielectric material that is singular through assembly, whereas embodiments proposed can incorporate heterogeneous dielectric materials with substantially different thermal and mechanical properties. Traditional systems may use high thermal conductivity material used as a build platform having the rest of the PCB process build around it, but do not provide consideration for embedded active die components due to the requirement of electrical conductivity with the proposed subject area. Traditional systems may include a thick conductor that is not electrically isolated, and hence, cannot be directly attached to a heat-sink without electrical isolation, and also have a single material stack up instead of heterogeneous dielectric material as in embodiments of this disclosure. Traditional systems do not include symmetrical stack ups, meaning that the layer thicknesses will be limited due to CTE induced delamination of various layers, for example, and handling of copper coins requires processes not easily compatible with standard PCB equipment.

Embodiments of this disclosure can be used for miniaturized power components with very high-power density demands, e.g., guided projectiles, radar power supplies, etc. Embodiment can provide a high thermal conductivity epoxy resin based power converter and assembly.

Embodiments can include embedded power devices in a heterogeneous substrate with high thermal conductivity materials forming the dielectric for a microvia network. Using embodiments of this disclosure overcomes the requirement of the highly thermally conductive epoxy sheets being required to flow to form the entire assembly. High flow resin materials can be used in the embedding process at normal temperatures and pressure, with high k sheets forming the structure being used to hold the power die in place only for process. Hence, the power devices can be alleviated in terms of temperature, allowing for further miniaturization.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit board assembly, comprising:
   a circuit component die;
   a first epoxy resin sheet disposed on a first side of the circuit component die, the first epoxy resin sheet having a first thermal conductivity and a first glass transition temperature that exceeds safe temperatures of the circuit component;

a second epoxy resin sheet having the first thermal conductivity and the first glass transition temperature disposed on a second side of the circuit component die; and a bulk dielectric material having a second thermal conductivity that is less than the first thermal conductivity of the first and second epoxy resin sheets, the bulk dielectric material having a second glass transition temperature that is less than the first glass transition temperature of the first and second epoxy resin sheets, wherein the bulk dielectric material is in contact with lateral sides of the circuit component die, the first epoxy resin sheet, and the second epoxy resin sheet to laterally enclose the circuit component die, the first epoxy resin sheet, and the second epoxy resin sheet.

2. The assembly of claim 1, wherein the first epoxy resin sheet is flush with the bulk dielectric material such that the first epoxy resin sheet and the bulk dielectric material form a first planar surface.

3. The assembly of claim 2, wherein the second epoxy resin sheet is flush with the bulk dielectric material such that the second epoxy resin sheet and the bulk dielectric material form a second planar surface.

4. The assembly of claim 3, further comprising a first conductive layer disposed in contact with the first planar surface to be in contact with the first epoxy resin sheet and the bulk dielectric material.

5. The assembly of claim 4, further comprising a second conductive layer disposed in contact with the second planar surface to be in contact with the second epoxy resin sheet and the bulk dielectric material.

6. The assembly of claim 5, further comprising one or more first vias defined through the first conductive layer and the first epoxy resin sheet to the circuit component die, and one or more second vias defined through the second conductive layer and the second epoxy resin sheet to the circuit component die.

7. The assembly of claim 6, wherein the one or more first vias and the one or more second vias are filled with conductive material.

8. A method for embedding a circuit component die within a circuit board assembly, comprising:

disposing a first epoxy resin sheet having a first thermal conductivity and a first glass transition temperature on a first conducive layer;

disposing the circuit component die on the first epoxy resin sheet, the circuit component die having safe temperatures that are less than the glass transition temperature of the epoxy resin sheet;

disposing a second epoxy resin sheet having the first thermal conductivity and the first glass transition temperature on the circuit component die;

stacking a plurality of sheets of a bulk dielectric material having a second thermal conductivity that is less than the first thermal conductivity of the first and second epoxy resin sheets on the first conductive layer and around the first epoxy resin sheet, the second epoxy resin sheet, and the circuit component die, wherein each of the plurality of sheets of the bulk dielectric includes an opening at least as wide as the first epoxy resin sheet and the second epoxy resin sheet, the bulk dielectric material having a second glass transition temperature that is less than the first glass transition temperature of the first and second epoxy resin sheets;

disposing a second conductive layer on the second epoxy resin sheet and the stacked plurality of sheets of the bulk dielectric material to form a sandwich structure having the first epoxy resin sheet, the second epoxy resin sheet, the circuit component die, and the bulk dielectric material between the first conductive layer and the second conductive layer; and heating the sandwich structure to a temperature at or above the second glass transition temperature of the bulk dielectric material but below the first glass transition temperature of the first epoxy resin sheet and the second epoxy resin sheet to flow the bulk dielectric material around the first epoxy resin sheet, the second epoxy resin sheet, and the circuit component die to remove air pockets.

9. The method of claim 8, further comprising milling one or more first vias through the first conductive layer and the first epoxy resin sheet to the circuit component die.

10. The method of claim 9, further comprising milling one or more second vias defined through the second conductive layer and the second epoxy resin sheet to the circuit component die.

11. The method of claim 10, wherein milling includes UV drilling and cleaning.

12. The method of claim 11, further comprising filling the one or more first vias and one or more second vias with conductive material.

13. The method of claim 12, wherein filling includes a deposition process.

14. The method of claim 13, wherein the deposition process includes copper plating.

15. The method of claim 14, further comprising adding additional circuit board structure on to the first conductive layer and the second conductive layer.

16. The method of claim 15, further comprising thick copper bonding the assembly with a third epoxy resin sheet having the first thermal conductivity.

\* \* \* \* \*